United States Patent [19]

Janesch et al.

[11] Patent Number: 6,097,768
[45] Date of Patent: Aug. 1, 2000

[54] PHASE DETECTOR FOR CARRIER RECOVERY IN A DQPSK RECEIVER

[75] Inventors: Stephen T. Janesch; Alan F. Hendrickson; Paul G. Schnizlein, all of Austin, Tex.

[73] Assignee: DPS Group, Inc., Santa Clara, Calif.

[21] Appl. No.: 08/968,202

[22] Filed: Nov. 12, 1997

Related U.S. Application Data

[60] Provisional application No. 60/031,350, Nov. 21, 1996.

[51] Int. Cl.$^7$ ...................................................... H03D 3/22
[52] U.S. Cl. ........................... 375/330; 375/375; 329/309
[58] Field of Search ................................... 375/259, 261, 375/283, 269, 326, 327, 330, 329, 308, 375; 329/304, 306, 309, 310; 332/103, 104; 455/42

[56] References Cited

U.S. PATENT DOCUMENTS

| | | | |
|---|---|---|---|
| 3,646,446 | 2/1972 | Rittenbach . | |
| 4,243,941 | 1/1981 | Zdunek . | |
| 4,879,728 | 11/1989 | Tarallo | 375/80 |
| 5,083,304 | 1/1992 | Cahill | 375/98 |
| 5,150,384 | 9/1992 | Cahill | 375/97 |
| 5,440,587 | 8/1995 | Ishikawa et al. | 375/332 |
| 5,588,027 | 12/1996 | Lim | 375/330 |
| 5,654,989 | 8/1997 | Gurney et al. | 375/335 |

FOREIGN PATENT DOCUMENTS

| | | |
|---|---|---|
| 0 320 058 A2 | 6/1989 | European Pat. Off. . |
| 2 213 663 | 8/1989 | United Kingdom . |

OTHER PUBLICATIONS

XP002062128 Serizawa, "An Adaptive Carrier Tracking Loop For Digital Satellite Mobile Communications," IEEE Conference on Communications, vol. 3, Jun. 7–10, 1987, Seattle, Washington, pp. 1754–1760.

XP000269407 Uchishima, et al, "Burst DSP Demodulator For Low EB/No Operation,", Communications—Rising to the Heights, Denver, Jun. 23–26, 1991, vol. 1, Institute of Electrical and Electronics Engineers, pp. 226–230.

International Search Report for PCT/US 97/21467 dated Apr. 21, 1998.

James, "A Digitally Implemented QPSK Modem Operating At Up to 10 Mbit/s," The GEC Journal of Research 7(1989) No. 1, Chelmsford, Essex, GB, 4 sheets.

Hansen, et al, "VLSI Digital PSK Demodulator for Space Communication," 100 European Transactions on Telecommunications and Related Technologies 4(1993) Jan./Feb., No. 1, Milano, IT, pp. 43–52.

Gardner, F., *"Phaselock Techniques,"* Second Edition, John Wiley & Sons, New York, 1979, pp. 165, 175 and 194.

*Primary Examiner*—Chi H. Pham
*Assistant Examiner*—Emmanuel Bayard
*Attorney, Agent, or Firm*—Conley, Rose & Tayon; Jeffrey C. Hood; Cyrus F. Barucha

[57] ABSTRACT

A phase detector using simple arithmetic operations to measure phase errors in the carrier-recovery mechanism for a DQPSK digital communications receiver. The carrier-recovery mechanism is a feedback loop that provides a synchronization between the oscillators in the transmitter and receiver of the communications system; the phase detector measures deviations from this synchronization and generates a phase-error signal used in the feedback loop to synchronize the oscillators. To perform this measurement, the phase detector takes the received signal as input and compares it against a local oscillator in the receiver to generate two digital signals: the in-phase (I) and quadrature-phase (Q) components of the received signal. These signals are the input to a logic unit, which uses these two signals to determine the phase-error signal. In one embodiment of the phase detector, the logic unit analyzes the signs of the two digital signals and then accordingly adds or subtracts the I and Q signals to generate the phase-error signal. In another embodiment, the logic unit determines the magnitude of the phase-error signal by finding the difference in magnitudes of the two digital signals and constructing a phase-error signal proportional to this difference. The logic unit then determines the sign of the phase-error signal by analyzing the signs of the I and Q digital signals. The logic unit thus uses simple arithmetic operations to generate the phase-error signal, thereby reducing the complexity and cost of the phase detector.

9 Claims, 11 Drawing Sheets

| Sign(I) | Sign(Q) | LOGIC UNIT OUTPUT |
|---|---|---|
| + | + | $-(|I|-|Q|)$ |
| − | + | $(|I|-|Q|)$ |
| − | − | $-(|I|-|Q|)$ |
| + | − | $(|I|-|Q|)$ |

FIG. 6

| Sign(I) | Sign(Q) | LOGIC UNIT OUTPUT |
|---|---|---|
| + | + | -I+Q |
| - | + | -I-Q |
| - | - | I-Q |
| + | - | I+Q |

FIG. 8

PHASE DETECTOR FOR CARRIER RECOVERY IN A DQPSK RECEIVER

This application claims the benefit of priority of U.S. Provisional Application No. 60/031,350, titled "Spread Spectrum Cordless Telephone System and Method" and filed Nov. 21, 1996, whose inventors were Alan Hendrickson, Paul Schnizlein, Stephen T. Janesch, and Ed Bell.

BACKGROUND OF THE INVENTION

1. Field of the Invention

The invention relates to electronic communications and, more particularly, to a phase detector in the carrier-recovery mechanism of a differential-quadriphase-shift-keying (DQPSK) digital receiver.

2. Description of the Related Art

Quadriphase shift keying (QPSK) is a technique of phase modulating digital information onto a carrier signal. QPSK communications systems are generally known in the art. In these systems, a transmission unit uses a local reference oscillator to generate a carrier wave. This oscillator in the transmitter determines the frequency and phase of the unmodulated carrier wave. The transmitter encodes two bits of digital information on the carrier by shifting the carrier phase by a multiple of 90° for an interval of time of length T. The four possible phase shifts, or symbols, that can be transmitted during this interval are determined by the four possible combinations of the two bits to be transmitted. One symbol (two bits of information) is transmitted during each time interval, so the rate of transfer of data in the system is two bits per symbol interval T. On the other end of this system, a receiving unit decodes the two transmitted bits by measuring the phase shift between the received signal and a local reference oscillator.

A drawback to this system is the requirement that the receiver must have a reference oscillator matched in phase to the transmitter oscillator; that is, the decoding is done by coherent detection. This requirement is relaxed in the technique of differential QPSK (DQPSK). In DQPSK, the transmitted data are differentially encoded, that is, they are represented by the difference in phase between successive symbols. In this technique, the receiver does not need the absolute phase of the transmitter oscillator to decode the transmitted symbols. Instead, the decoding of the symbols is by differentially coherent detection: the receiver measures the phase difference between two successive received symbols. This measurement yields a number with four possible values (0°, 90°, 180°, 270°) that represents the two bits of transmitted data.

To demodulate the received signal, it is desirable for the DQPSK receiver to have a local oscillator that reconstructs the carrier wave. This oscillator in the receiver must match the frequency (although not necessarily the phase) of the DQPSK transmitter oscillator that generated the carrier wave. If the frequencies of the two oscillators are not matched, the receiver cannot efficiently demodulate the transmitted data. The receiver oscillator can be built so that its natural frequency is close to that of the transmitter, but due to variations in manufacturing and differences in operating environments, there will be drifts between the two oscillators. To compensate for such offsets in frequency between the carrier wave and the receiver oscillator, the receiver oscillator can be locked to the carrier wave by a phase-locked loop (PLL). Such a carrier-recovery mechanism can serve to tie the frequency of the receiver oscillator to the frequency of the transmitter oscillator.

This carrier-recovery mechanism must be able to ignore variations in the carrier phase that are due to the information encoded into the carrier. That is, changes in the phase of the carrier by multiples of 90° must not be interpreted as a drift in the receiver oscillator's frequency. There are several established methods of making the PLL in the carrier-recovery mechanism insensitive to the data-bearing 90° shifts.

One method involves generating the fourth power of the received signal. This new signal has a high-frequency component at four times the carrier frequency. The phase of this high-frequency component is coherent with the carrier and independent of the phase shifts representing the encoded data. This high-frequency component can thus serve as a good reference for locking the receiver oscillator. Various Costas-loop circuits can also be used to lock the oscillator; these circuits have characteristics similar to the fourth-power lock.

A second method for locking the receiver oscillator to the unmodulated carrier involves examining two components of the received signal: one that is in phase with the receiver oscillator (I), and one that is 90° out of phase with the receiver oscillator (Q). The I component has a maximum magnitude when the receiver oscillator and the received signal are in phase or 180° out of phase, and a zero magnitude when they are 90° or 270° out of phase. The Q component has the opposite behavior: its magnitude is zero when the I component's magnitude is greatest, and a maximum when the I component's magnitude is zero. The I and Q components have equal magnitudes when the receiver and transmitter oscillators differ in phase by ±45° or ±135°. Since this condition occurs at four different phase shifts 90° apart, it is insensitive to jumps in the received signal's phase by 90°. Therefore, the balance between the I and Q components can also provide a good reference for the PLL in the carrier-recovery mechanism. By adjusting the receiver oscillator so that the magnitudes of the I and Q components remain equal, the PLL can keep the receiver oscillator's phase locked to a constant shift (of 45°, −45°, 135°, or −135°) from the transmitter oscillator's phase. Two oscillators thus locked to within a constant phase shift are consequently also locked in frequency, so the receiver oscillator can provide the appropriate reference for demodulating the transmitted data.

An elementary method of keeping the I and Q magnitudes equal is to multiply them together and use a PLL to maximize the resulting product. This method, however, requires use of a multiplication block, which adds complexity to the system. The present invention overcomes this problem of the prior technology by providing a phase detector that measures the I and Q components and directly constructs a phase-error signal that indicates an imbalance between them using simple arithmetic operations. The present invention thus provides a significant improvement and advance in the art and technology of carrier recovery in DQPSK receivers.

SUMMARY OF THE INVENTION

The present invention comprises a phase detector for the receiver of a differential quadriphase-shift-keying (DQPSK) digital communications system. In such a communications system, a transmitter generates a carrier wave using a transmitter oscillator. This oscillator determines the frequency and phase of the carrier. The transmitter unit then modulates the phase of the carrier to create a transmitted signal; the data are encoded into this signal as DQPSK symbols. This signal is transmitted through a communications channel to a receiver in the communications system. The receiver uses a receiver oscillator as a reference to compare the relative phase between successive symbols in the received signal; comparing these phases allows a decoding of the DQPSK data.

The phase detector presented in this invention can be used as a part of a phase-locked loop (PLL) to provide carrier recovery in the receiver. A carrier-recovery mechanism is necessary to keep the receiver oscillator locked in frequency to the carrier wave. An important component of the PLL is its phase detector, which measures the difference in phase between the receiver oscillator and the carrier wave. The phase detector generates a phase-error signal proportional to this difference. This phase detector ignores shifts due to the phase-shift keying that encodes the digital data; that is, it ignores jumps in the received signal's phase that are multiples of ninety degrees.

To perform this measurement, the phase detector in the present invention comprises several components. The phase detector includes two mixers that each take the received signal as input. The first of these mixers multiplies the received signal with a signal that is in phase with the receiver oscillator; the second mixer multiplies the received signal by a signal that is 90° out of phase with the receiver oscillator. The difference-frequency components of these two mixer outputs represent the components of the received signal that are in phase and 90° out of phase with the receiver oscillator. The two mixer outputs are then digitized in sampling units, which may also low-pass filter and integrate the signals and decimate them to an appropriate data rate.

The sampling units produce two digital signals: a first digital signal that represents the component of the received signal that is in phase with the receiver oscillator (the I component), and a second digital signal that represents the component of the received signal that is 90° out of phase with the receiver oscillator (the Q component).

The I and Q digital signals are the input of a logic unit. The phase difference between the receiver oscillator and the carrier wave is proportional to the difference in magnitudes of the two digital signals (for small offsets). The logic unit thus uses these two signals to determine the phase-error signal.

In one embodiment of the invention, the logic unit analyzes the signs of the two digital signals and then accordingly adds or subtracts the I and Q signals to generate the phase-error signal.

In another embodiment, the logic unit determines the magnitude of the phase-error signal by finding the difference in magnitudes of the two digital signals and constructing a phase-error signal proportional to this difference. The logic unit then determines the sign of the phase-error signal by analyzing the signs of the I and Q digital signals.

The logic unit thus uses the simple arithmetic operations of addition and subtraction to generate the phase-error signal, thereby reducing the complexity and cost of the phase detector.

BRIEF DESCRIPTION OF THE DRAWINGS

Other objects and advantages of the invention will become apparent upon reading the following detailed description and upon reference to the accompanying drawings in which:

FIG. 6 illustrates an embodiment of the logic unit;

FIG. 8 illustrates an embodiment of the logic unit that adds or subtracts the I and Q digital signals to generate a phase-error signal.

DESCRIPTION OF THE PREFERRED EMBODIMENTS

The following patents and patent applications are hereby incorporated by reference in their entirety as though fully and completely set forth herein:

U.S. Provisional Application Ser. No. 60/031350 (docket # 5000-87300/TT1797), titled "Spread Spectrum Cordless Telephone System and Method" and filed Nov. 21, 1996, whose inventors are Alan Hendrickson, Paul Schnizlein, Stephen T. Janesch, and Ed Bell;

U.S. application No. 08/968,030 (docket # 5000-89400/ TT1690), titled "A Digital Carrier Recovery Loop" and filed Nov. 12, 1997, whose inventor are Paul Schnizlein, Alan Hendrickson, and Stephen T. Janesch now U.S. Pat. No. 5,966,416;

U.S. application Ser. No. 08/975,142 (docket # 5000-89700/TT1694), titled "Matched Filter and Differential Decoder for a Digital Communications Receiver Front End" and filed Nov. 20, 1997, whose inventors are Alan Hendrickson and Paul Schnizlein;

U.S. application Ser. No. 09/078,225, titled "Symbol-Quality Evaluation in a Digital Communications Receiver" and filed May 13, 1998, whose inventor is Alan Hendrickson;

U.S. application Ser. No. 08/968,028, titled "A Programmable Loop Filter for Carrier Recovery in a Radio Receiver" and filed Nov. 12, 1997, whose inventors are Stephen T. Janesch and Paul Schnizlein;

U.S. application Ser. No. 08/968,029, titled "A Carrier-Recovery Loop with Stored Initialization in a Radio Receiver" and filed Nov. 12, 1997, whose inventors are Stephen T. Janesch, Paul Schnizlein, and Ed Bell; and U.S. application Ser. No. 09/078,145, titled "A Method for Compensating Filtering Delays in a Spread-Spectrum Receiver" and filed May 13, 1998, whose inventor is Alan Hendrickson now U.S. Pat. No. 5,940, 435.

Figure 1:
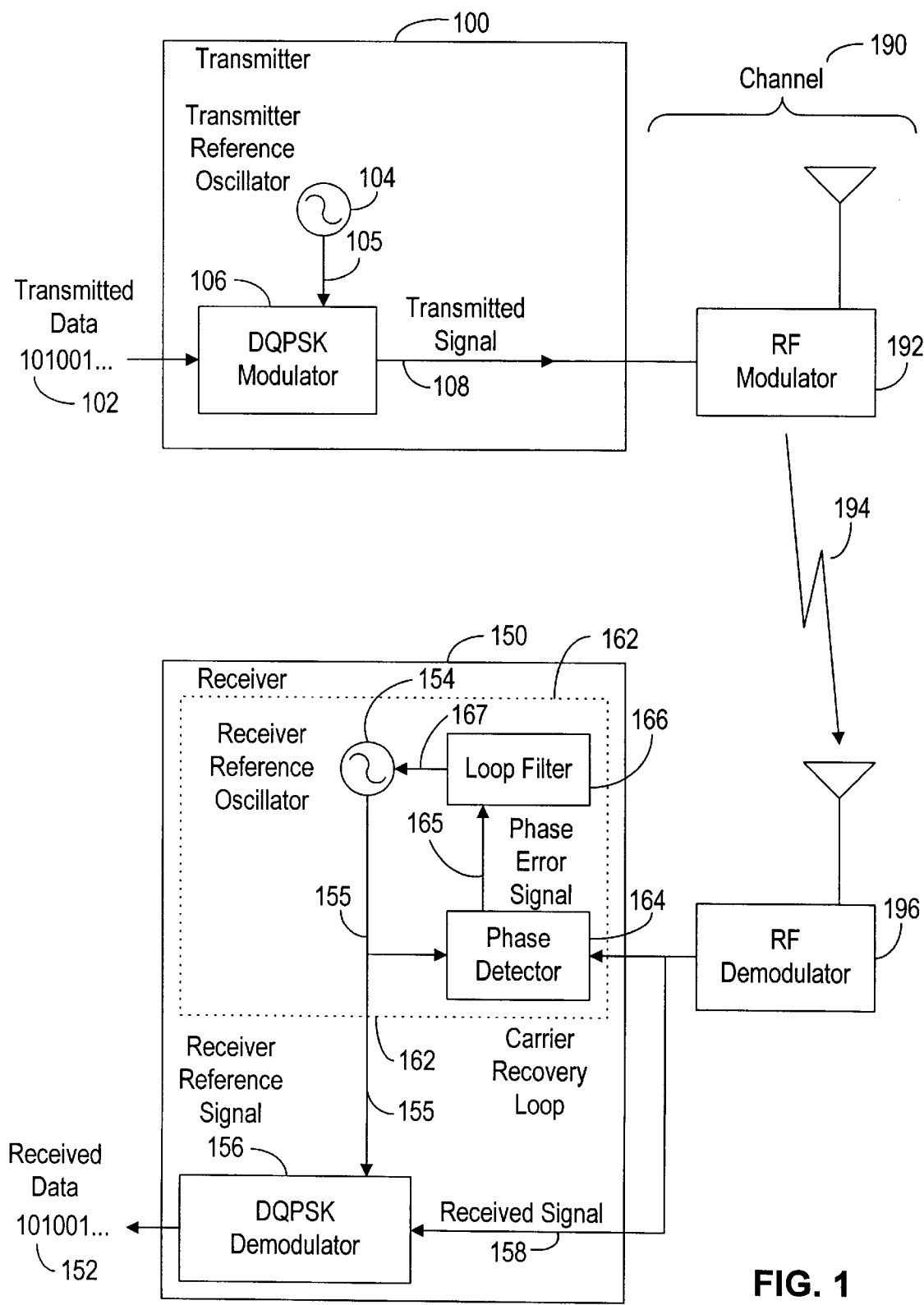
FIG. 1 is a block diagram of a telecommunication system.

FIG. 1: DQPSK Communication Systems

As shown in FIG. 1, a differential-quadriphase-shift-keying (DQPSK) communication system comprises at least one transmitter 100 and one receiver 150 for the communication of data. Such communication systems are well known in the art. In the transmitter 100, digital data 102 are provided to a DQPSK modulator 106. A transmitter reference oscillator 104 generates a sinusoidal carrier wave 105 for the DQPSK modulator 106. The digital data 102 are encoded onto the sinusoidal carrier wave 105 by the DQPSK modulator 106 which shifts the carrier's phase by multiples of 90° according to the technique of DQPSK modulation, a technique well-known in the art. In this technique, the modulator 106 shifts the phase of the carrier wave by multiples of 90° to generate a transmitted signal 108. As described earlier in "Background of the Invention", these phase shifts are the symbols that encode the data. Each symbol lasts for a duration of time T after which the next phase shift is introduced to the carrier. The differences in phase angle between successive symbols represent the transmitted data 102. Since there are four possible symbols (shifts of 0°, 90°, 180°, or 270°), each phase difference represents two bits of the transmitted data.

The carrier wave's frequency is determined by the reference oscillator 104 in the transmitter. The transmitted signal 108 is the sinusoidal carrier wave with the data-bearing phase shifts of duration T. The transmitted signal 108 is sent via a physical communication channel 190 to the DQPSK receiver 150.

The channel depicted in this figure is a radio transmission system that modulates the DQPSK transmitted signal onto a radio wave 194 with a frequency greater than the carrier wave frequency. The channel 190 depicted here comprises the radio-frequency (RF) modulator 192, the radio wave 194 transmitted through the air, and the RF demodulator 196. As would be known to one skilled in the art, other communications channels such as transmission line, waveguide, or optical fiber systems, can of course be used instead of (or in conjunction with) the depicted radio transmission system.

Under ideal conditions, the received signal 158 would be an exact replica of the transmitted signal 108. In practice, there may be some differences between these two signals due to degradation suffered in the communication channel. The transmitted and received signals 108 and 158 may also have slightly different carrier frequencies because of differences between the frequencies of the RF modulator 192 and demodulator 196. In the receiver 150, a DQPSK demodulator 156 receives the received signal 158 and demodulates it to extract the received data 152, completing the communication of the payload data. Ideally, the received data 152 would replicate the transmitted data 102, but in practice the two sets of data may differ due to encoding errors in the transmitter, decoding errors in the receiver, or degradation of the transmitted signal in the communications channel.

The difference between phases of the received signal during successive symbol times T indicates the received data; thus, comparing these phases allows the decoding of the DQPSK data. To determine these phases, the demodulator 156 requires a reference signal oscillating at the carrier frequency of the received signal 158, which is the frequency of the carrier wave 105 plus or minus any difference between the frequencies of the RF modulator 192 and demodulator 196. In the receiver 150 shown here, the original carrier wave 105 is not available to provide this reference. Instead, the reference signal 155 is generated by a local oscillator 154 that provides it to the demodulator 156. The reference signal 155 needs only to match the carrier of the received signal 158 in frequency; it may have a constant shift in phase from the carrier. Such a shift is inconsequential to the demodulation of the data, since in DQPSK modulation (as in all differential phase-shift keying) the symbols are differentially decoded; that is, received data are determined by the difference in phase between successive symbols.

Figure 2:
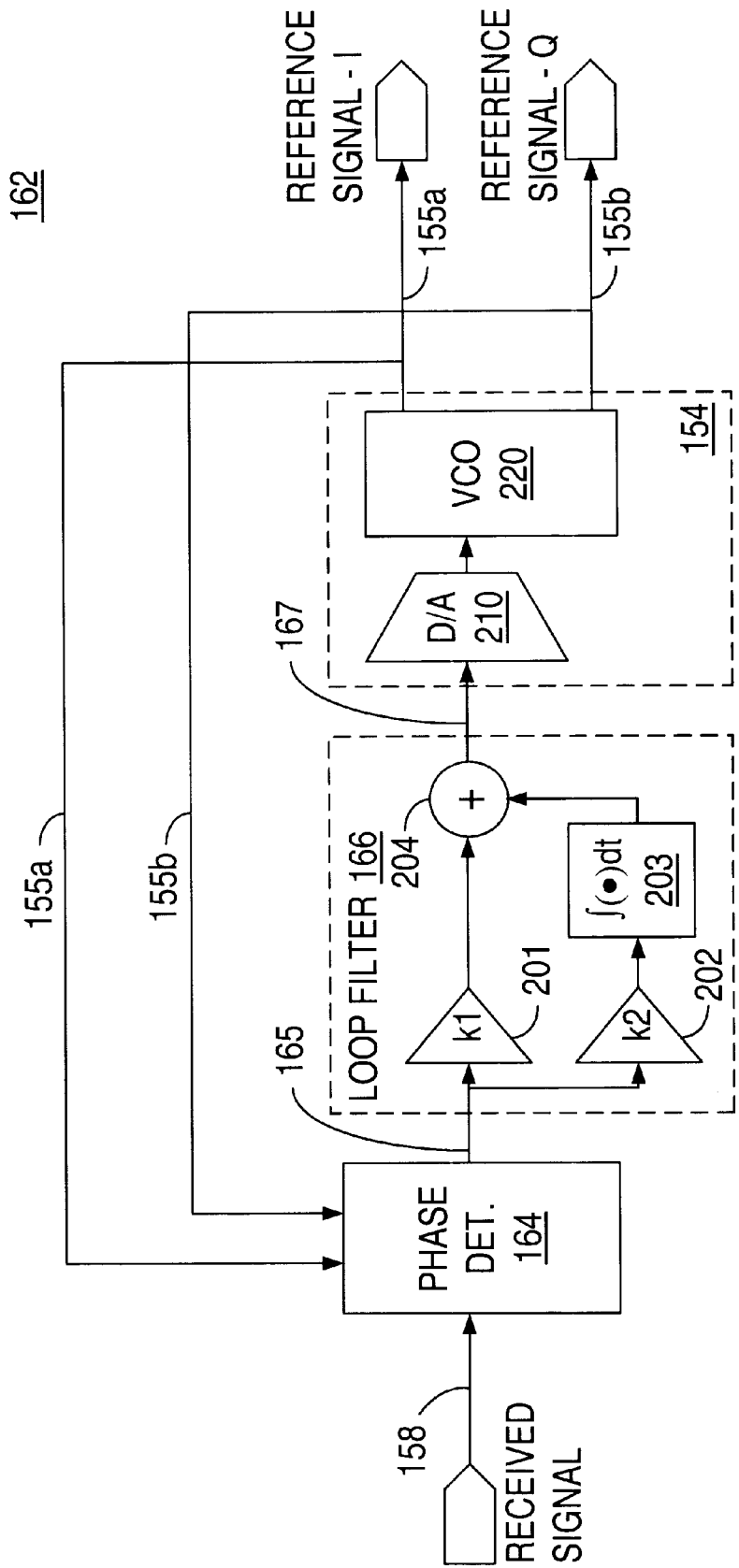
FIG. 2 illustrates the carrier-recovery mechanism.

FIG. 2: Carrier Recovery

To keep the receiver oscillator 154 matched to the received signal's carrier, the receiver oscillator 154 is a part of a feedback loop that controls its frequency. This feedback loop makes a carrier-recovery mechanism 162 that matches the frequency of the receiver reference signal 155 to that of the carrier of the received signal 158.

The receiver 150 depicted in FIG. 1 has a basic block diagram of the carrier-recovery mechanism 162. The carrier-recovery mechanism 162 includes a phase detector 164, which compares the phase of the reference signal 155 (generated by the receiver oscillator 154) to the phase of the carrier wave in the received signal 158, and generates a phase-error signal 165 indicative of the difference between these phases. The phase detector 164 comprises a novel configuration as described below.

The phase-error signal 165 is then provided to a loop filter 166. The signal 165 is conditioned in the loop filter 166, typically by a combination of low-pass filtering and integration, to generate a digital feedback signal 167. The feedback signal 167 is fed back to the receiver oscillator 154 to nullify offsets from the carrier frequency.

The basic principle of this feedback loop is similar to that of a textbook phase-locked loop (PLL), but with an important difference: here the phase detector 164 must be sensitive only to changes in the phase of the received signal 158 that are not due to the encoded data. By ignoring the data-bearing phase shifts, the detector can provide a good measure of the phase error between the receiver oscillator 154 and the carrier wave 105. As required, the signal generated by the receiver oscillator 154 in this loop differs from the carrier wave by a constant phase shift, and is locked in frequency to the carrier wave.

FIG. 2 shows an embodiment of the carrier-recovery mechanism 162 employing digital signals. The phase detector 164 receives the received signal 158 and generates the digital phase-error signal 165, which is provided to a loop filter 166 containing digital processing elements. The loop filter 166 is a low-pass filter that suppresses the high-frequency components of the phase-error signal 165 and passes the constant (DC) value representative of the carrier frequency of the received signal 158. The output of the loop filter 166 is the digital feedback signal 167.

In one embodiment of the carrier-recovery mechanism 162, the loop filter 166 comprises a multiplier with a weighting value k1 201, which receives the phase-error signal 165 and provides an output to a digital adder 204. The loop filter 166 also comprises a multiplier with a weighting value k2 202, which receives the phase-error signal 165 and provides an output to an integrator 203, which in turn provides an output to the digital adder 204. The digital adder 204 provides an output 167 to a digital-to-analog converter 210, which provides its analog output to the receiver oscillator 154. The integrator 203 accumulates the value of the phase-error signal 165 after it has been scaled by the weighting value k2 202. The digital adder 204 adds this integrated signal with a version of the original phase-error signal that has been scaled by the weighting value k1 201; the output of the adder 204 is the digital feedback signal 167.

The digital feedback signal 167 is fed back to the receiver oscillator 154. In this embodiment of the carrier-recovery mechanism, the receiver oscillator 154 is a digitally controlled oscillator (DCO) comprising a digital-to-analog (D/A) converter 210 and a voltage-controlled oscillator (VCO) 220. The D/A converter 210 receives the digital feedback signal 167 generates an analog signal in response to the feedback signal 167. The VCO 220 receives the output of the D/A converter 210 and produces two versions of the receiver reference signal 155: an in-phase reference signal 155*a* and a quadrature-phase reference signal 155*b*. Both of these signals are provided to the phase detector 164 for comparison with the received signal 158. In another embodiment of the invention, the receiver oscillator 154 is an all-digital DCO that receives digital feedback signal 167 and directly synthesizes the recovered signal at the frequency indicated by the digital feedback signal 167.

The reference signals 155a and 155b are also provided to the DQPSK demodulator 156. As discussed below, these reference signals have phase offsets of 45°, 135°, 225°, or 315° from the received carrier when the recovery loop is in phase lock. In one embodiment of the receiver 150, the receiver generates shifted copies (not shown) of the reference signals that are offset by 45°, 135°, 225°, or 315° from the original reference signals 155a and 155b. These shifted copies are provided to the DQPSK demodulator 156 to allow better demodulation of the received signal 158.

Figure 3:
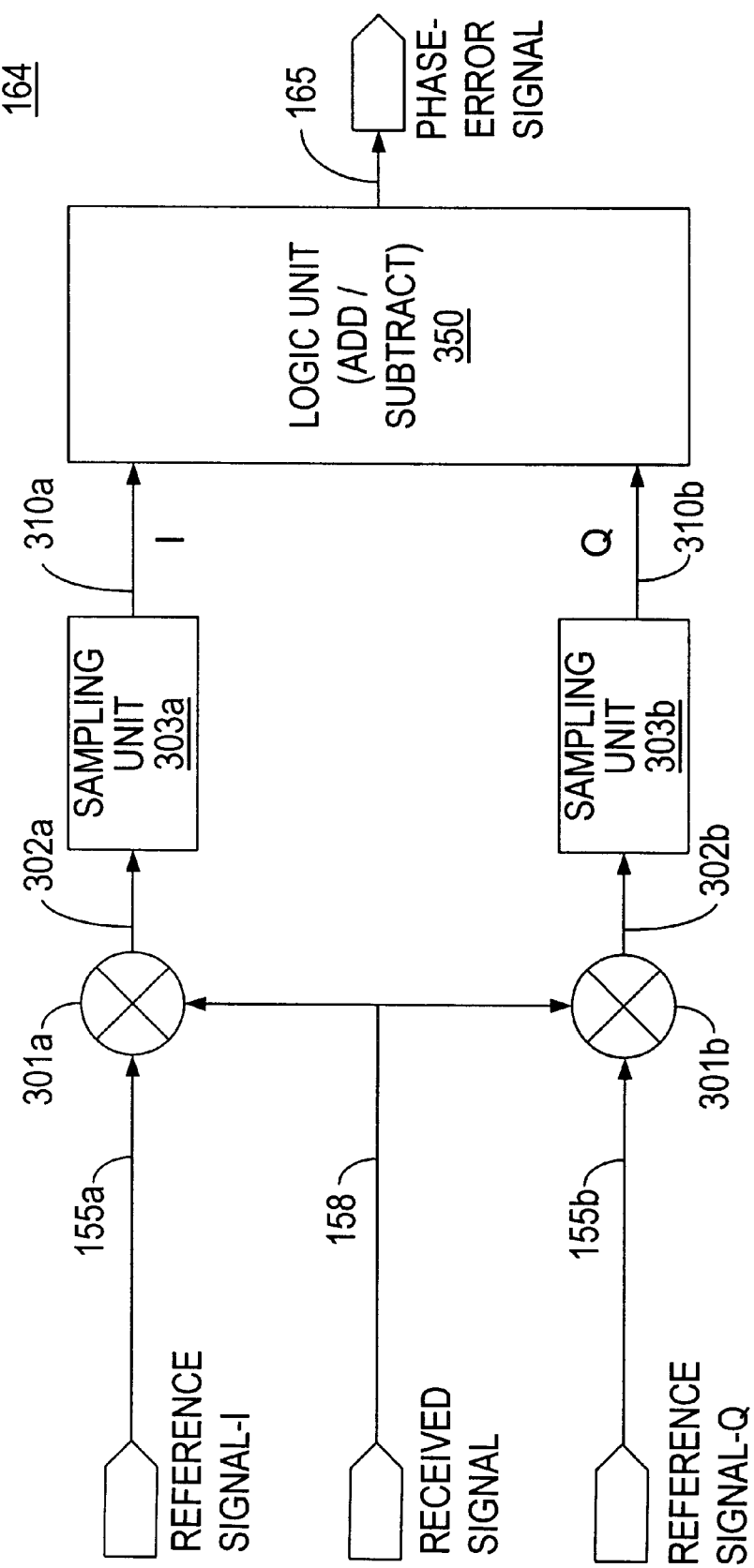
FIG. 3 is a block diagram of the receiver phase detector.
Figure 4:
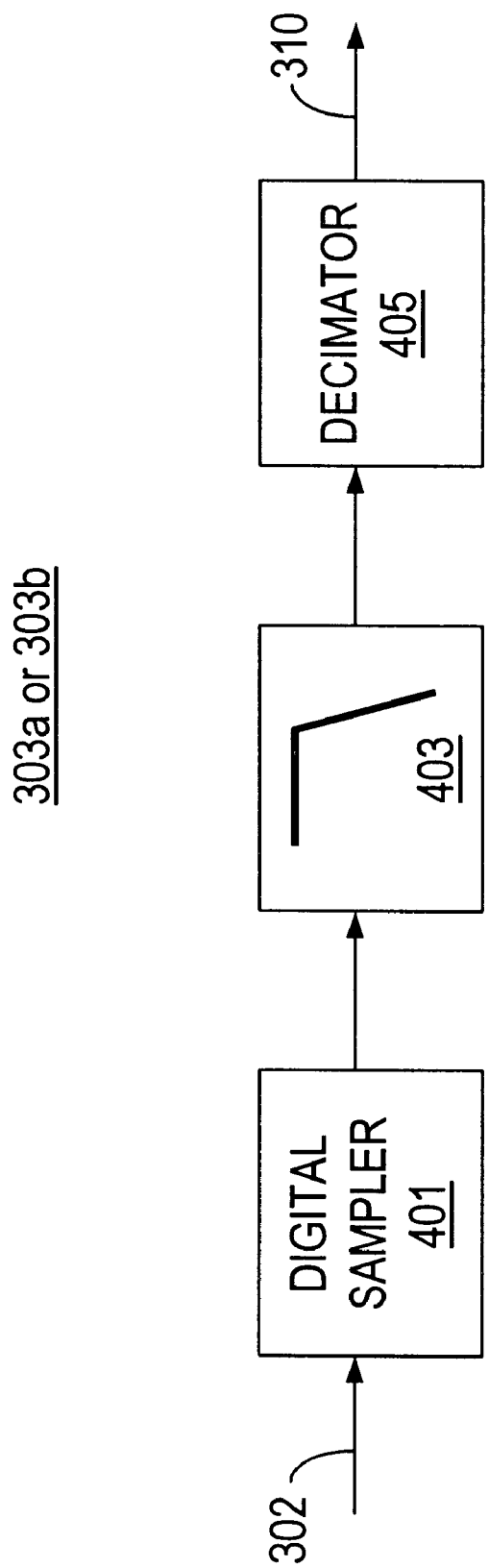
FIG. 4 is a block diagram of an embodiment of the sampling unit in the receiver phase detector.

FIGS. 3 and 4: The Phase Detector

FIG. 3 presents an embodiment of the present invention, the phase detector 164 of the carrier-recovery mechanism 162. This phase detector of the preferred embodiment has three inputs, one for the received signal 158 from which the detector gains information on the frequency of the carrier of the received signal 158, a second for the in-phase reference signal 155a, and a third for the quadrature-phase reference signal 155b. A first mixer 301a receives the in-phase reference signal 155a, and a second mixer 301b receives the quadrature-phase reference signal 155b. These two mixers 301a and 301b each also receive the received signal from the received-signal input 158 and multiply the received signal by the respective reference signals to generate outputs 302a and 302b.

The mixer outputs 302a and 302b are sent to the two sampling units 303a and 303b respectively, which digitize them into two digital signals. These digital signals are the in-phase (I) 310a and quadrature-phase (Q) 310b components of the received signal 158 (relative to the receiver reference signal 155). The logic unit 350 receives the I and Q components 310a and 310b from the sampling units 303a and 303b and uses them to construct the phase-error signal 165.

FIG. 4 is a block diagram illustrating one embodiment of the sampling unit 303a or 303b. As shown, each sampling unit preferably includes a digital sampler 404, a digital low-pass filter 403, and a decimator 405. The sampling units 303a and 303b each preferably include a digital sampler 401 that converts the output of the preceding mixer 301a or 301b into a digital signal with a high sample rate. The output of the digital sampler 401 is provided to a low-pass filter 403, which filters out its high-frequency components. The low-pass filter 403 is a digital finite impulse response filter, which provides good phase linearity. The output of the filter is provided to a decimator 405, which reproduces the signal at a slower sample rate. The resulting digital signal 310 is either the in-phase (I) 310a or quadrature-phase (Q) 310b component of the received signal 158. These two digital signals 310a and 310b, from the sampling units 303a and 303b respectively, are provided to the logic unit 350 to determine the phase error 165.

To understand the operation of the logic unit, it is helpful to consider the expressions for the I and Q components 310a and 310b of the received signal 158. The received signal 158 can be described by a sinusoid R(t) with a carrier frequency $\omega_C$ and a phase shift from the carrier of 0°, 90°, 180°, or 270° (=$l\pi/2$) that represents the transmitted symbol. In addition to this information-bearing phase, the received signal 158 has an amplitude A. Thus the received signal 158 has the mathematical form R(t)=A cos($\omega_C t - l\pi/2$). The two reference signals 155a and 155b are periodic signals with the frequency $\omega_R$ of the receiver reference oscillator 154. The in-phase and quadrature-phase phase reference signals 155a and 155b have a phase offset of $\pi/2$ between them, so they can be represented by the expressions cos($\omega_R t+\phi$) and sin($\omega_R t+\phi$) respectively. Here $\phi(t)$ indicates the phase offset between the received carrier and the reference oscillator. The outputs of the mixers 301a and 301b are the products of these reference signals with the received signal, so the mixer outputs 302a and 302b have the following forms.

$$\text{Signal } 302a = A \, \cos(\omega_C t - l\pi/2)\cos(\omega_R t+\phi)$$

$$\text{Signal } 302b = A \, \cos(\omega_C t - l\pi/2)\sin(\omega_R t+\phi) \quad \text{Eq. 1}$$

By using trigonometric identities, these equations can be re-expressed as sinusoids at the sum and difference frequencies $\omega_R \pm \omega_C$.

$$\text{Signal } 302a = \quad \text{Eq. 2}$$
$$\frac{A}{2}[\cos((\omega_R - \omega_C)t + l\pi/2 + \phi) + \cos((\omega_R + \omega_C)t - l\pi/2 + \phi)]$$

$$\text{Signal } 302b =$$
$$\frac{A}{2}[\sin((\omega_R - \omega_C)t + l\pi/2 + \phi) + \sin((\omega_R + \omega_C)t - l\pi/2 + \phi)]$$

The sampling units 303a and 303b receive these two signals 302a and 302b. The signals are filtered in the low pass filters 403 in the sampling units as described earlier. The low-pass filters 403 are designed to render the sum-frequency components in the above expressions insignificant. Thus the I and Q digital signals 310a and 310b produced by the sampling units 303a and 303b have only the difference-frequency components indicated by the following expressions.

$$I = \frac{A}{2}\cos((\omega_R - \omega_C)t + l\pi/2 + \phi) \quad \text{Eq. 3}$$

$$Q = \frac{A}{2}\sin((\omega_R - \omega_C)t + l\pi/2 + \phi)$$

The carrier-recovery mechanism 162 operates to keep the receiver oscillator 154 phase-locked to the carrier, so that the frequencies $\omega_R$ and $\omega_C$ are equal. In particular, the carrier-recovery mechanism 162 keeps the phase difference $\phi(t)$ between the receiver oscillator 154 and the carrier locked to a value of either 45°, 135°, 225°, or 315° (=$\pi/4+m\pi/2$). In operation, there are additional phase drifts, denoted by $\delta(t)$, between the oscillator 154 and the carrier. Considering these drifts, the phase difference $\phi(t)$ can be written as $\phi(t)=\pi/4+m\pi/2+\delta(t)$. Using this expression and the condition that $\omega_R=\omega_C$ when the carrier-recovery loop 162 is phase-locked, Equation 3 becomes an expression for the I and Q signals 310a and 310b in terms of the phase error $\delta(t)$.

$$I = \frac{A}{2}\cos\left(\frac{n\pi}{2} + \frac{\pi}{4} + \delta(t)\right) \quad \text{Eq. 4}$$

$$Q = \frac{A}{2}\sin\left(\frac{n\pi}{2} + \frac{\pi}{4} + \delta(t)\right)$$

with,
$n \equiv l+m = 0,1,2,3$ and $$\delta(t) = \left[-\frac{\pi}{4}, \frac{\pi}{4}\right)$$

The argument $\theta(t) = n\pi/2 + \pi/4 + \delta(t)$ $(=\phi(t)+l\pi/2)$ is the total difference in phase between the received signal 158 and the receiver reference signal 155. This phase difference is the sum of (1) the offset $\phi(t)$ between the received carrier and the receiver oscillator 154 and (2) the information-bearing phase shifts $l\pi/2$.

The two expressions in Equation 4 can be inverted: given particular values of I and Q, it is possible to determine the amplitude A, the quadrant index n, and the phase error $\delta(t)$ (within the ranges indicated for n and $\delta(t)$). The purpose of the phase detector 164 is to measure the phase error $\delta(t)$ and produce the phase-error signal 165 indicating the value of $\delta(t)$. As was shown in FIG. 3, the mixers 301a and 301b and the sampling units 303a and 303b in the phase detector 164 generate the I and Q signals 310a and 310b from the input signals 155a, 155b, and 158. The logic unit 350 in the phase detector then calculates the phase error $\delta(t)$ from the I and Q signals. The following section describes how the logic unit uses the relationships in Equation 4 to perform this calculation.

Figure 5:
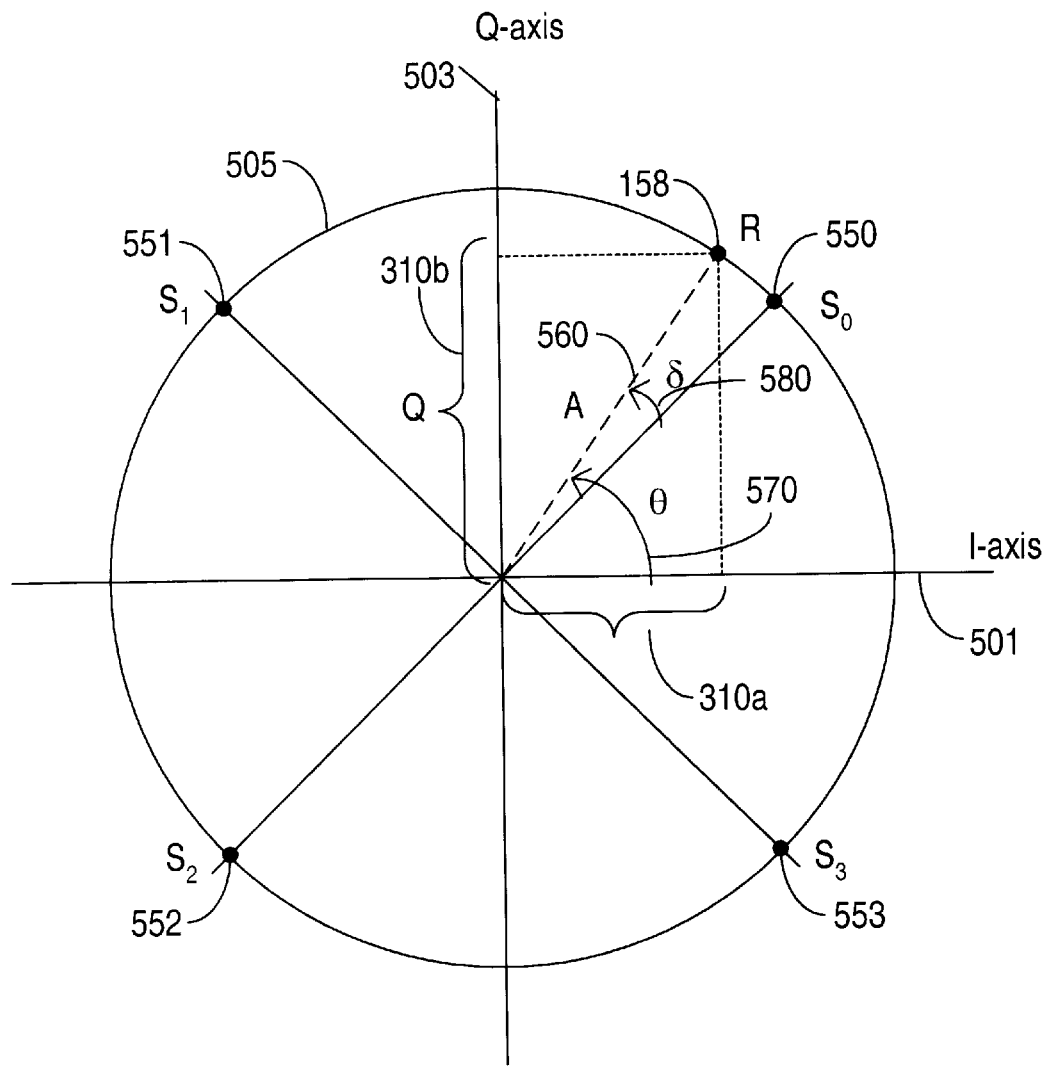
FIG. 5 shows the symbol space of the received QPSK symbols.

FIG. 5: Constructing the error signal

FIG. 5 illustrates graphically the relationships in Equation 4. It shows the relationships between the received signal R 158, the I and Q signals 310a and 310b, and the phases $\delta(t)$ and $\theta(t)$. In particular, this graph illustrates conceptually how the I and Q signals 310a and 310b are related to the phase error $\delta(t)$ 580. In this graph, the I-axis 501 and the Q-axis 503 span the space of possible received signals 158. The received signal 158 can be represented in this space by a vector with a length A 560 representing the amplitude of the received signal, and an angle $\theta(t)$ 570 from the I-axis representing its total phase difference from the receiver reference signal.

According to the Equation 4, the projection of this vector onto the I-axis then represents the I signal 310a. Similarly, its projection onto the Q-axis represents the Q signal 310b. Note that this geometric picture is consistent with the definition of $\theta(t)$ $(=\phi(t)+l\pi/2)$, and the expressions for R(t) and the in-phase and quadrature-phase reference signals. In particular, a phase difference of $\theta(t)=0$ (which places the R vector on the +I axis) occurs when the received signal R(t) in phase with the in-phase reference signal 155a. With a phase difference of $\theta(t)=90°$ (which places the R vector on the +Q axis) the received signal is in phase with the quadrature-phase reference signal 155b.

The angle $\delta(t)$ 580 is the phase error of the received signal. The phase error $\delta(t)$ is the phase difference between the received signal R(t) and the nearest of the four lock points labeled $S_n$ (n=0,1,2,3) 550, 551, 552, and 553. When the phase error $\delta(t)$ is zero, the vector for the received signal lies on top of one of the four lock points $S_n$ 550, 551, 552, and 553.

As indicated in FIG. 5, these lock points are located at 45° from the positive and negative I and Q axes. These locations reflect the choice to keep the phase difference $\phi(t)$ between the receiver oscillator 154 and the received carrier locked to a value of either 45°, 135°, 225°, or 315°. Note that this implies that the received carrier is also locked at a phase offset of 45°, 135°, 225°, or 315° from the I and Q reference signals 155a and 155b.

The choice of the four lock points 550, 551, 552, and 553 is made because at these lock points, the I and Q signals have equal magnitudes. This symmetry of the lock points allows a simplified implementation of the phase detector. If the phase error is nonzero but small, then it can be shown that the phase error is proportional to the difference between the magnitudes of the I and Q signals. To see this, we invert Equation 4 to get an expression for the phase error $\delta(t)$.

$$\cos\delta(t) = \frac{2}{A}\left[+I\cos\left(\frac{n\pi}{2}+\frac{\pi}{4}\right) + Q\sin\left(\frac{n\pi}{2}+\frac{\pi}{4}\right)\right] \quad \text{Eq. 5}$$

$$\sin\delta(t) = \frac{2}{A}\left[-I\sin\left(\frac{n\pi}{2}+\frac{\pi}{4}\right) + Q\cos\left(\frac{n\pi}{2}+\frac{\pi}{4}\right)\right],$$

$n = 0, 1, 2, 3$

For small values of the phase error, these expressions can be simplified using the small-angle approximation ($\epsilon \ll 1 \Rightarrow \cos\epsilon \approx 1, \sin\epsilon \approx \epsilon$).

$$\delta(t) = \frac{\sqrt{2}}{A}(a_n I + b_n Q), \quad \text{Eq. 6}$$

$n = 0, 1, 2, 3$ with,
$a_0 = -1 \quad b_0 = +1$
$a_1 = -1 \quad b_1 = -1$
$a_2 = +1 \quad b_2 = -1$
$a_3 = +1 \quad b_3 = +1$ Although derived using the small-angle approximation this expression is accurate to within 0.08 radians over the entire range of $\delta(t)$ ($-\pi/4$ to $+\pi/4$).

The variable n indicates which of the four symbols is being transmitted. For small phase errors, the symbol can be deduced from the signs of the I and Q signals. As can be seen from FIG. 5, the symbol corresponding to n=0 leads to positive values for I and Q. Similarly, a positive value for I and a negative value for Q indicate that the transmitted symbol corresponds to n=3.

With this observation, Equation 6 can be rewritten in terms of the absolute values of the signals.

$$\delta(t) = \frac{\sqrt{2}}{A}c_n(|I| - |Q|), \quad \text{Eq. 7}$$

$n = 0, 1, 2, 3$ with
$c_0 = -1$
$c_1 = +1$
$c_2 = -1$
$c_3 = +1$

Thus the phase error 580 is proportional to the difference between the magnitudes of the I and Q signals 310a and 310b.

The digital signals 310a and 310b representing the I and Q components of the received signal 158 are the inputs to the logic unit 350 (from FIG. 3). Since the index n of the transmitted symbol can be deduced from the signs of the I and Q signals, Equations 6 and 7 provide a means for the logic unit 350 to find the phase error δ(t) 580 without prior knowledge of the transmitted symbol.

The derivation leading to Equations 6 and 7 assumed that the inputs to the phase detector were sinusoids. But these result are valid measures of the phase error δ(t) even if the received signal, the in-phase reference signal 155a, and the quadrature phase reference signal 155b have some other functional form such as amplitude-limited square pulses. Equations 1–7 generally describe the results from the fundamental Fourier components of the three input signals 158, 155a, and 155b. The digital low-pass filter 403 in the sampling units 303a and 303b can be used to attenuate frequency components arising from higher-order Fourier components of the three input signals. Thus Equation 6 is valid for input signals 158, 155a, and 155b more general than the sinusoids that this discussion has assumed. In one embodiment of the invention, the three input signals 158, 155a, and 155b are all amplitude-limited (bi-valued) analog signals. The phase detector 164 in this embodiment nonetheless provides a good measure of the phase error δ(t) in the phase-error signal 165.

Figure 7:
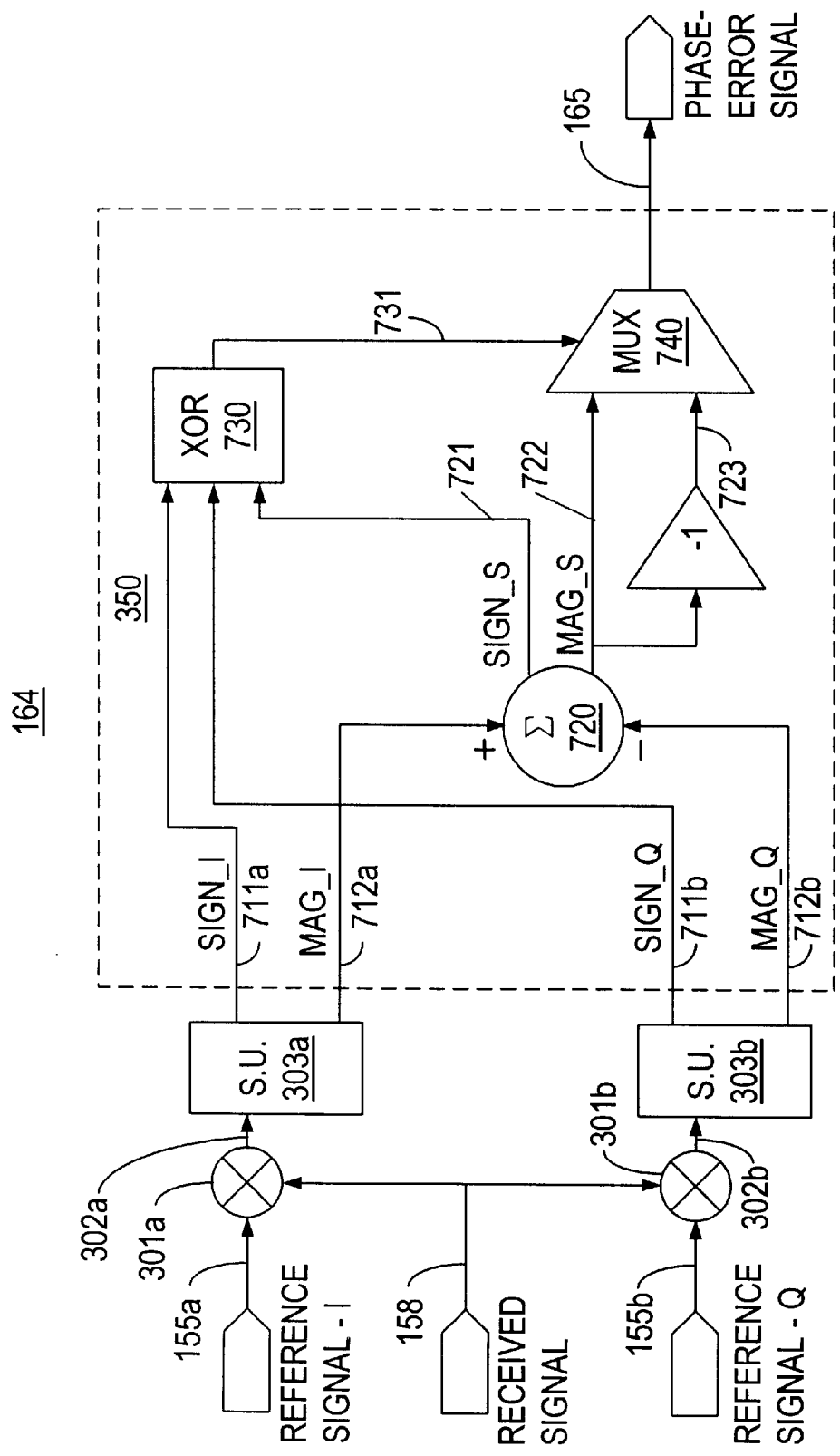
FIG. 7 illustrates an embodiment of the phase detector.

FIGS. 6 and 7: The Logic Unit

FIG. 6 illustrates an embodiment of the operations performed by the logic unit 350. As shown, the logic unit 350 first determines the magnitudes of the I and Q digital signals 310a and 310b, and then finds the difference between these magnitudes. As described in Equation 7, this difference, with the appropriate sign, is a useful phase-error signal 165. As would be appreciated by one skilled in the art, the functionality presented in this figure can be readily implemented in the digital circuitry of the logic unit.

The phase detector in FIG. 7 presents one embodiment of circuitry to realize the logical function of FIG. 6. In this embodiment, an adder 720 constructs the difference |I|−|Q| 721 and an XOR gate 730 and a multiplexer 740 determine the sign of the phase-error signal 165.

In more detail, the phase detector 164 has the same received signal inputs 158 and reference signal inputs 155a and 155b as were described in FIG. 1 and FIG. 3. The mixers 301a and 301b, mixer outputs 302a and 302b, and sampling units 303a and 303b are also the same as described in FIG. 3. The digital signals 310a and 310b representing the I and Q components of the received signal (in FIG. 3) are each expressed as sign and magnitude components in this embodiment. The Sign_I 711a and Sign_Q 711b signals indicate the signs of the I and Q digital signals. The magnitudes of the I and Q digital signals are carried in the Mag_I 712a and Mag_Q 712b signals.

The two magnitude signals 712a and 712b are the inputs to the adder 720, which calculates their difference in the form of a sign signal Sign_S 721 and a magnitude signal Mag_S 722. The XOR gate 730 accepts three sign signals as inputs, the Sign_I signal 711a, the Sign_Q signal 711b, and the Sign_S signal 721, and generates an output signal 731. This XOR output is a one if an odd number of the XOR inputs indicate negative values; otherwise the XOR output is a zero. The multiplexer 740 accepts the XOR output 731 as a control input. The selection inputs for the multiplexer are the magnitude signal Mag_S 722 generated by the adder and its complement 723. The multiplexer 740 provides the Mag_S signal 722 as its output 165 if it receives a one from the XOR gate 730. If the multiplexer 740 receives a zero from the XOR gate 730, it provides the compliment 723 of Mag_S as the output phase-error signal 165. The connectivity of the adder, the XOR gate, and the multiplexer operates to make this output signal consistent with the logic unit output described in FIG. 6.

Figure 8:
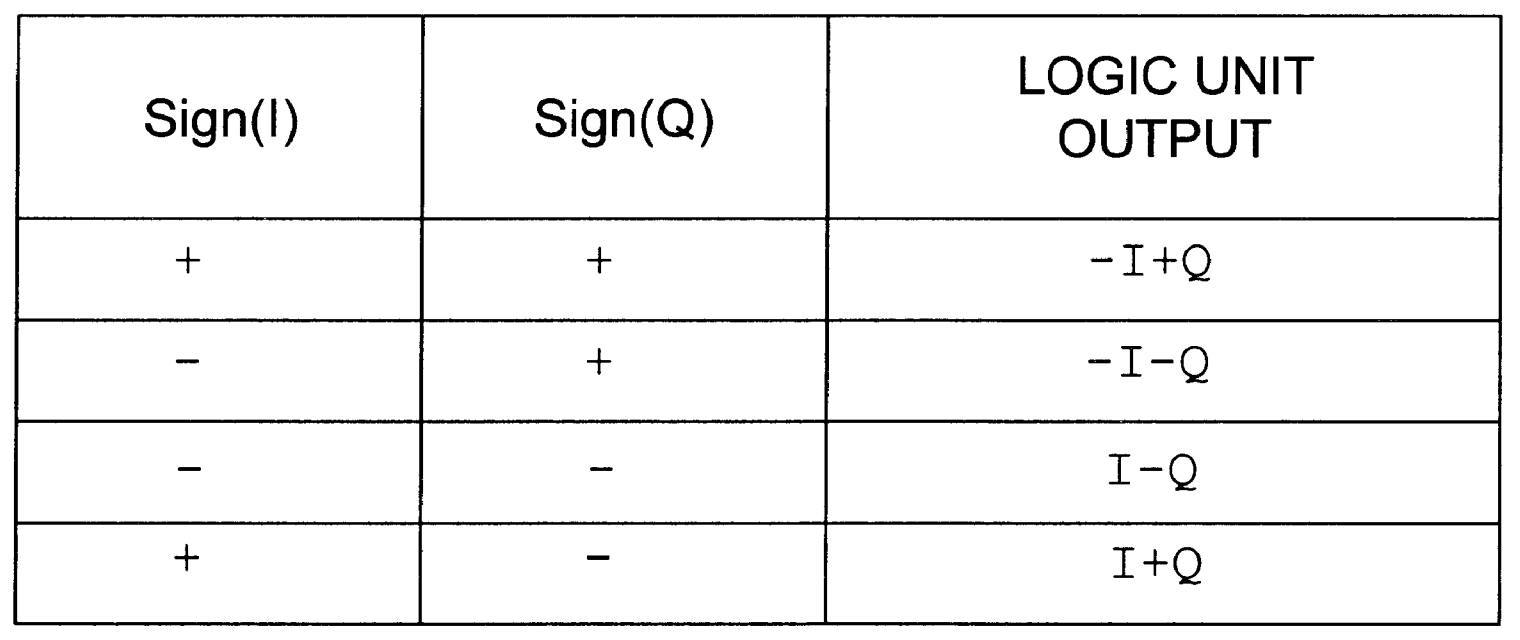
Figure 9:
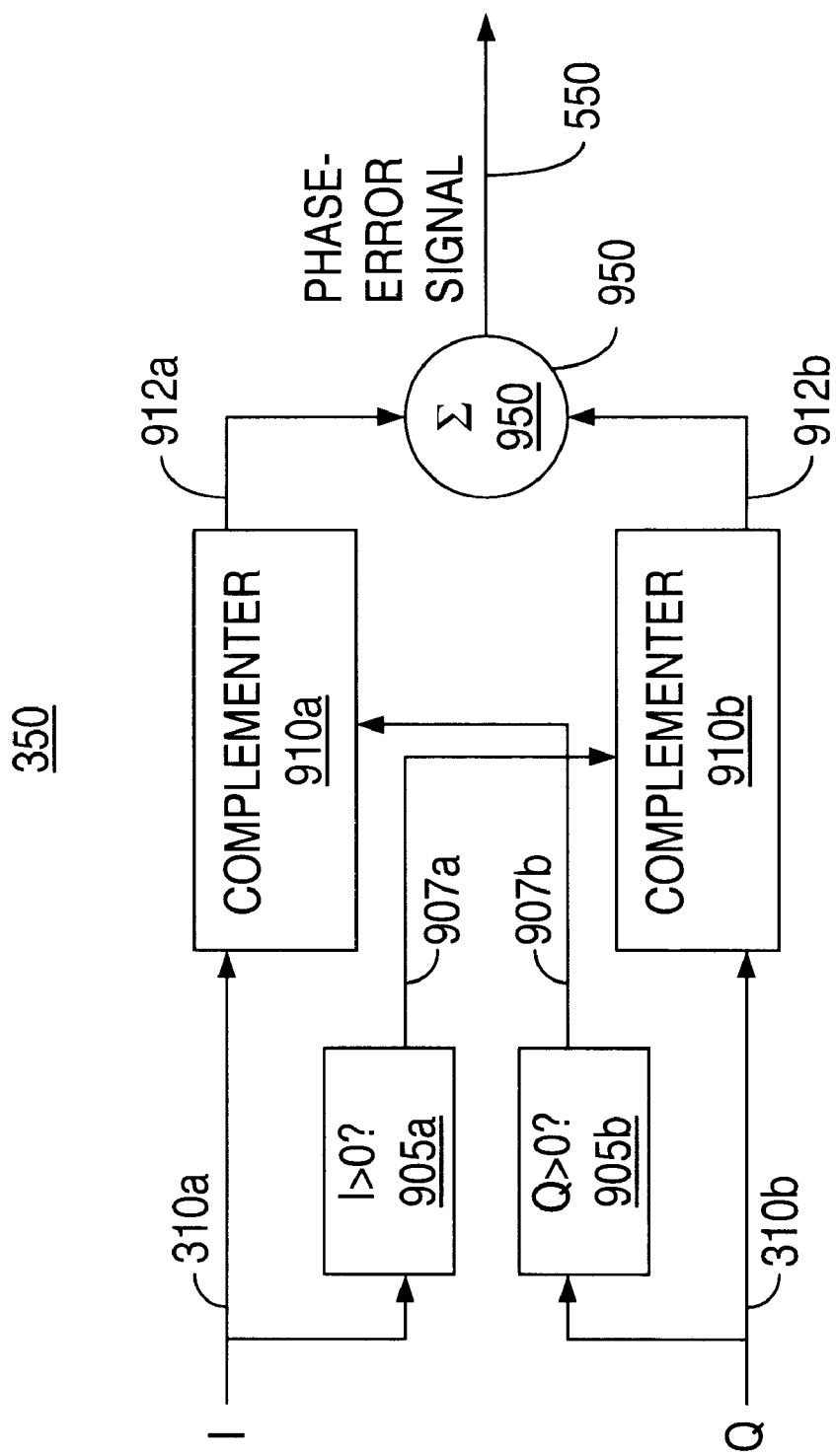
FIG. 9 illustrates an embodiment of the logic unit in a receiver's phase detector.

FIGS. 8 and 9: The Logic Unit—Simplified Construction

FIG. 8 shows another embodiment of the functionality in the logic unit 350. This embodiment uses the results of Equation 6 to determine the phase-error signal 165 from the I and Q digital signals 310a and 310b. With the functionality shown in this figure, the logic unit 350 adds or subtracts the two digital signals depending on their signs; the result of the addition or subtraction is a quantity that can serve as the phase-error signal 165 since it is proportional to the phase error 580.

FIG. 9 depicts a circuit implementation of the logic unit described in FIG. 8. Here, the I digital signal 310a is an input to a first comparator 905a and the Q digital signal 310b is an input to a second comparator 905b. The I and Q signals are also inputs to a first and a second conditional complementer 910a and 910b respectively. The first comparator 905a generates an output 907a of 1 if the I digital signal 310a is negative, and generates a 0 otherwise. The second comparator 905b generates an output 907b of 1 if the Q digital signal 310b is positive, and a 1 otherwise.

Each conditional complementer generates an output as determined by a control signal. If the control signal is a 1, the output is the complement of the input. If the control signal is a 0, the output is a copy of the input.

The control signal to the first conditional complementer 910a is the output of the second comparator 905b, and the control signal to the second conditional complementer 910b is the output of the first comparator 905a. The outputs 912a and 912b of these two conditional complementers are thus copies or complements of the I and Q digital signals 310a and 310b. An adder 950 receives these two outputs 912a and 912b and adds them, thereby generating the phase-error signal 165.

Figure 10:
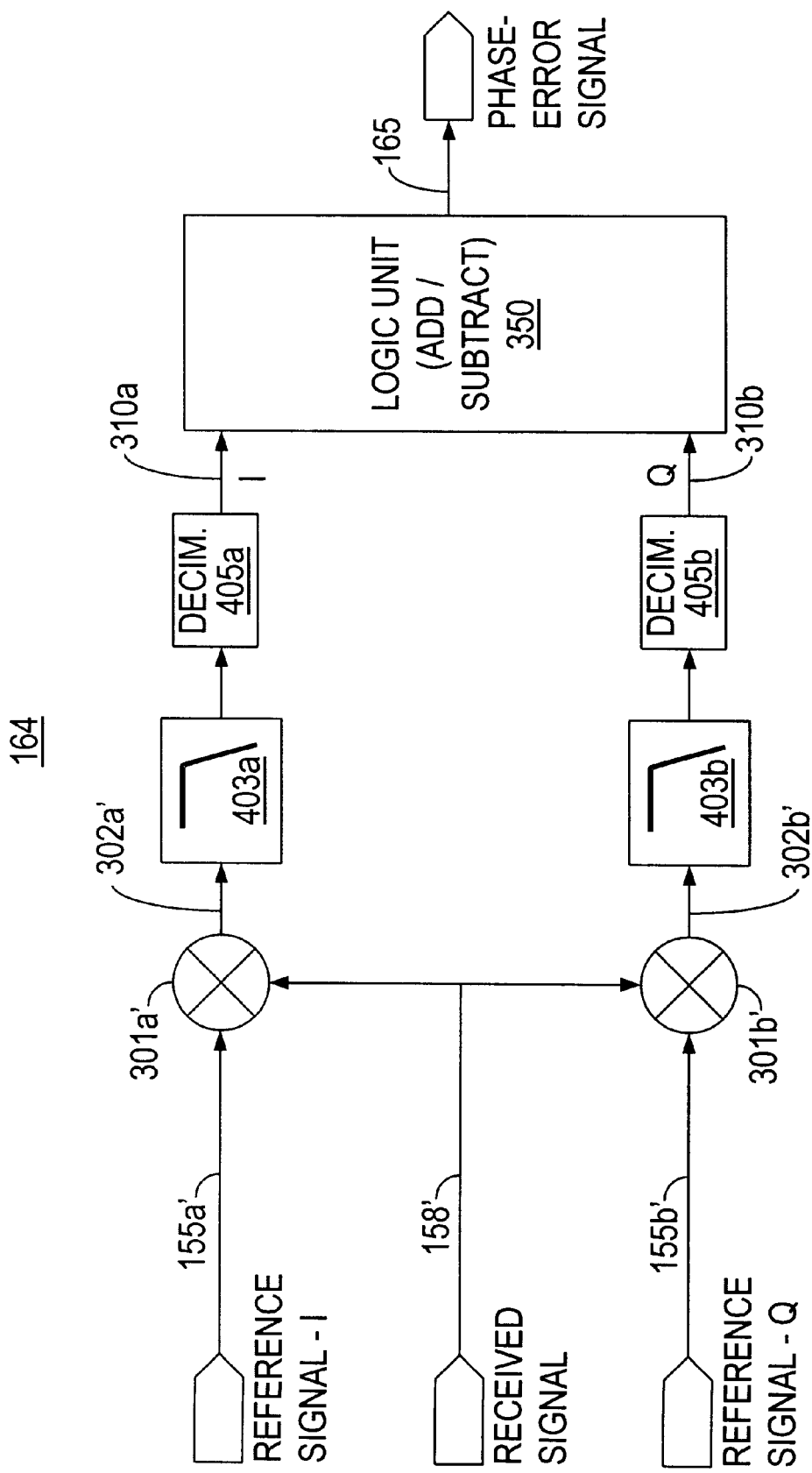
FIGS. 10 and 11 illustrate an alternative embodiments of the phase detector.
Figure 11:
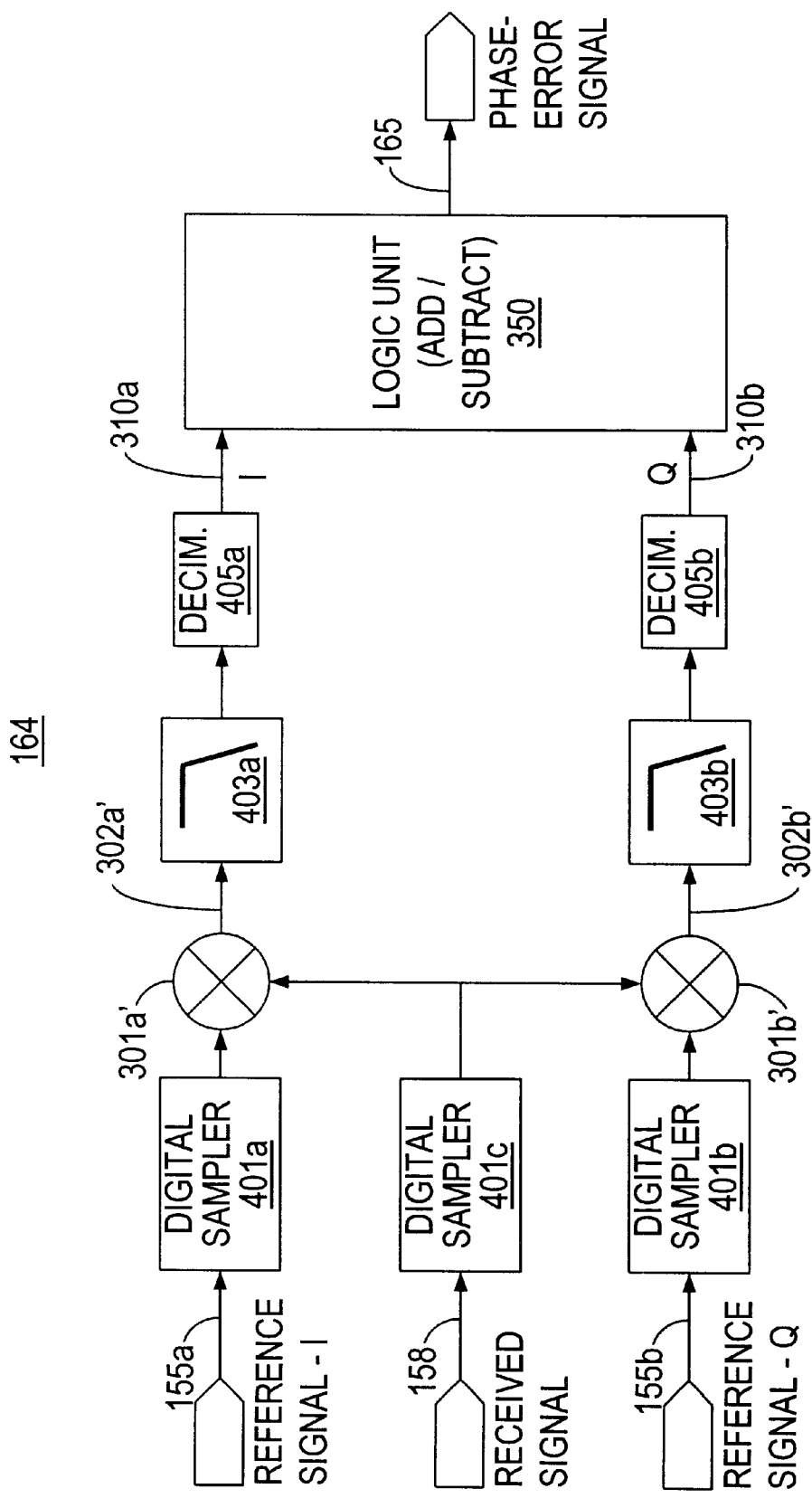

FIGS. 10 and 11: Alternative Embodiments of the Phase Detector

FIG. 10 is a block diagram of a second embodiment of the phase detector 164 described earlier (and shown in FIG. 3). The second embodiment has a similar structure and operation and connectivity as the first embodiment of the phase detector 164, but here the three input signals are digital signals. These inputs, the in-phase reference signal 155a', the quadrature-phase reference signal 155b', and the received signal 158' are all discrete-time digital versions of the corresponding analog signals 155a, 155b, and 158 discussed earlier. (For clarity, in this figure and the next, the primed labels indicate digital versions of previously described signals and components.) Since the three signals provided are already discrete-time signals, this embodiment of the phase detector does not have the digital samplers 401 that were in the sampling units 303a and 303b in the first embodiment of the phase detector 164. As shown in this figure, this embodiment does have the filters 403a and 403b and the decimators 405a and 405b that were in the sampling units 303a and 303b in the first embodiment of the phase detector 164. (Note that the filters 403a and 403b were previously designated by the label 403 in FIG. 4. Similarly, the decimators 405a and 405b were designated by the label 405.)

A further difference between the first and second embodiments of the phase detector 164 concerns the mixers 301a and 301b from FIG. 3. Since the signals 155a', 155b', and 158' provided to the mixers 301a' and 301b' are digital signals, the mixers 301a' and 301b' themselves are digital mixers. Thus this second embodiment of the phase detector comprises all-digital hardware. The filters 403a and 403b, the decimators 405a and 405b, and the logic unit 350 are all digital components as described earlier.

In FIG. 11, three digital samplers are added to the second embodiment of the phase detector 164 to make a block diagram of a third embodiment of the phase detector. In this third embodiment, the in-phase reference signal 155a, the quadrature-phase reference signal 155b, and the received signal 158 are all analog signals as were used in the first embodiment of the phase detector. In this third embodiment, these three signals 155a, 155b, and 158 are provided to the digital samplers 401a, 401b, and 401c respectively, which generate digital discrete-time versions of the three input signal. The digital signals are provided to the digital mixers 301a' and 301b' as shown, and the remaining components function as was described for the second embodiment of the phase detector in FIG. 10. This third embodiment thus accepts continuous-time analog signals and converts them to digital signals for digital processing.

The present invention further contemplates three additional embodiments of the phase detector 162. These additional embodiments are described by a simple modification to the block diagrams in FIGS. 3, 10, and 11, which show the first three embodiments of the phase detector. In the three additional embodiments, the phase detector 162 does not have the decimators 405a or 405b. Instead, the filtered signals generated by the low-pass filters 403a and 403b are provided directly to the logic unit 350 (with the appropriate filter outputs provided to the appropriate inputs on the logic unit 350, as would be apparent to one skilled in the art of digital communications). Thus, the initial sample rates are not slowed in these three additional embodiments of the phase detector 162, and the logic unit 350 receives the I and Q digital signals 310a and 310b at their initial sample rate directly from the filters 403a and 403b.

It is to be understood that multiple variations, changes and modifications are possible in the aforementioned embodiments of the invention described herein. Although certain illustrative embodiments of the invention have been shown and described here, a wide range of modification, change, and substitution is contemplated in the foregoing disclosure and, in some instances, some features of the present invention may be employed without a corresponding use of the other features. Accordingly, it is appropriate that the foregoing description be construed broadly and understood as being given by way of illustration and example only, the spirit and scope of the invention being limited only by the appended claims.

We claim:

1. A phase detector for detecting a phase difference between a transmitter oscillator and a receiver oscillator in a differential quadriphase-shift-keying communications system, the phase detector comprising:

a first mixer that receives a received signal, wherein said received signal includes a frequency and phase generated by said transmitter oscillator, and wherein said first mixer multiplies said received signal with an in-phase signal of said receiver oscillator, and wherein said first mixer generates a first mixer output;

a second mixer that receives said received signal, wherein said second mixer multiplies said received signal with a quadrature-phase signal of said receiver oscillator, and wherein said second mixer generates a second mixer output;

a first sampling unit coupled to receive said first mixer output, wherein said first sampling unit produces a first digital signal comprising a sign and a magnitude, and wherein said first digital signal represents an in-phase component of said received signal in response to said first mixer output;

a second sampling unit coupled to receive said second mixer output, wherein said second sampling unit produces a second digital signal comprising a sign and a magnitude, and wherein said second digital signal represents a quadrature-phase component of said received signal in response to said second mixer output; and a logic unit coupled to said first sampling unit and to said second sampling unit wherein said logic unit receives said first and second digital signals, wherein said logic unit operates to calculate a phase-error signal that represents said phase difference between said transmitter oscillator and said receiver oscillator, and wherein said logic unit detects the difference between the magnitudes of said first and second digital signals in calculating the phase error signal.

2. The phase detector of claim 1, wherein one or more of said first and second sampling units each comprise:

a fast digital sampler coupled to its corresponding mixer output, wherein said fast digital sampler samples its corresponding mixer output at a first sample rate to generate a digital sampler output;

a digital filter coupled to the fast digital sampler, wherein said digital filter filters said digital sampler output to generate a digital filter output at said first sample rate; and a decimator coupled to the digital filter that re-samples said digital filter output to generate a sampling unit output at a second sample rate, wherein said second sample rate may be equal to or slower than said first sample rate.

3. The phase detector of claim 1, wherein one or more of said first and second sampling units each comprise:

a fast digital sampler coupled to its corresponding mixer output, wherein said fast digital sampler samples its corresponding mixer output at a sample rate to generate a digital sampler output; and a digital filter coupled to the fast digital sampler, wherein said digital filter filters said digital sampler output to generate a sampling unit output at said sample rate.

4. The phase detector of claim 1, wherein:

said logic unit operates to analyze said sign and said magnitude of each of said first digital signal and said second digital signal; and said logic unit computes said phase-error signal according to the following table, in which I and Q indicate said first and second digital signals respectively.

| Sign(I) | Sign(Q) | LOGIC UNIT (ADD/SUBTRACT) OUT |
|---|---|---|
| + | + | $-(|I| - |Q|)$ |
| − | + | $(|I| - |Q|)$ |
| − | − | $-(|I| - |Q|)$ |
| + | − | $(|I| - |Q|)$ |

5. The phase detector of claim 4, wherein said logic unit comprises:

an adder coupled to said first and second sampling units that calculates a difference between said magnitudes of said first and second digital signals and produces a sign and magnitude signal for said difference;

an exclusive-or gate that receives three sign signals from said first digital signal, from said second digital signal, and from said adder, and generates an output signal indicating if an odd number of said multiplexer inputs are negative;

an inverter that generates a negative value of said magnitude signal from said adder; and a multiplexer that takes for a control input said exclusive-or-gate output, and for selection inputs takes said magnitude signal from said adder and said negative value from said inverter, and generates a digital output according to the following table.

| XOR(Sign(I), Sign(Q) Sign(Adder)) | MULTIPLEXER OUTPUT |
|---|---|
| 0 | -\|ADDER OUTPUT\| |
| 1 | \|ADDER OUTPUT\| |

6. The phase detector of claim 1, wherein:

said logic unit operates to analyze said sign of each of said first digital signal and said second digital signal; and said logic unit computes said phase-error signal according to the following table, in which I and Q indicate said first and second digital signals respectively.

| Sign(I) | Sign(Q) | LOGIC UNIT (ADD/SUBTRACT) OUT |
|---|---|---|
| + | + | -I + Q |
| - | + | -I - Q |
| - | - | I - Q |
| + | - | I + Q |

7. The phase detector of claim 6, wherein said logic unit comprises:

a first comparator that receives said first digital signal and generates a first comparator output signal, wherein said first comparator output indicates if said first digital signal is negative;

a second comparator that receives said second digital signal and generates a second comparator output signal, wherein said second comparator output indicates if said second digital signal is positive;

a first conditional complementer that takes said first digital signal as input, wherein:
said first conditional complementer receives said second comparator output as a control signal,
said first conditional complementer generates a first conditionally complemented signal,
said first conditionally complemented signal is the complement of said first digital signal if said second comparator output is true, and wherein
said first conditionally complemented signal is the same as said first digital signal if said second comparator output is false;

a second conditional complementer that takes said second digital signal as input, wherein:
said second conditional complementer receives said first comparator output as a control signal,
said second conditional complementer generates a second conditionally complemented signal,
said second conditionally complemented signal is the complement of said second digital signal if said first comparator output is true, and wherein
said second conditionally complemented signal is the same as said second digital signal if said first comparator output is false; and an adder that receives said first and second conditionally complemented signals as inputs, and generates said phase-error signal by adding said first and second conditionally complemented signals.

8. A phase detector for detecting a phase difference between a transmitter oscillator and a receiver oscillator in a differential quadriphase-shift-keying communications system, the phase detector comprising:

a first digital mixer that receives a received digital signal, wherein said received digital signal includes a frequency and phase generated by said transmitter oscillator, wherein said first digital mixer multiplies said received digital signal with an in-phase digital signal of said receiver oscillator, and wherein said first digital mixer generates a first digital mixer output;

a second digital mixer that receives said received digital signal, wherein said second digital mixer multiplies said received digital signal with a quadrature-phase digital signal of said receiver oscillator, and wherein said second digital mixer generates a second digital mixer output;

a first digital filter coupled to the first digital mixer, wherein said first digital filter filters said first digital mixer output to generate a first digital filter output;

a second digital filter coupled to the second digital mixer, wherein said second digital filter filters said second digital mixer output to generate a second digital filter output;

a first decimator coupled to the first digital filter that samples said first digital filter output to generate a first digital signal at a sample rate;

a second decimator coupled to the second digital filter that samples said second digital filter output to generate a second digital signal at a sample rate; and a logic unit coupled to said first decimator and to said second decimator wherein said logic unit receives said first and second digital signals, wherein said logic unit operates to calculate a phase-error signal that represents said phase difference between said transmitter oscillator and said receiver oscillator, and wherein said logic unit detects the difference between the magnitudes of said first and second digital signals.

9. A phase detector for detecting a phase difference between a transmitter oscillator and a receiver oscillator in a differential quadriphase-shift-keying communications system, the phase detector comprising:

a first digital sampler that receives a received signal, wherein said received signal includes a frequency and phase generated by said transmitter oscillator, wherein said first digital sampler samples said received signal at a sample rate, and wherein said first digital sampler generates a first digital sampler output;

a second digital sampler that receives an in-phase signal of said receiver oscillator, wherein said second digital sampler samples said in-phase signal at a sample rate, and wherein said second digital sampler generates an in-phase digital signal;

a third digital sampler that receives a quadrature-phase signal of said receiver oscillator, wherein said third digital sampler samples said quadrature-phase signal at a sample rate, and wherein said third digital sampler generates a quadrature-phase digital signal;

a first digital mixer that multiplies said first digital sampler output with said in-phase digital signal, and wherein said first digital mixer generates a first digital mixer output;

a second digital mixer that multiplies said first digital sampler output with said quadrature-phase digital signal, and wherein said second digital mixer generates a second digital mixer output;

a first digital filter coupled to the first digital mixer, wherein said first digital filter filters said first digital mixer output to generate a first digital filter output;

a second digital filter coupled to the second digital mixer, wherein said second digital filter filters said second digital mixer output to generate a second digital filter output;

a first decimator coupled to the first digital filter that samples said first digital filter output to generate a first digital signal at a sample rate;

a second decimator coupled to the second digital filter that samples said second digital filter output to generate a second digital signal at a sample rate; and a logic unit coupled to said first decimator and to said second decimator wherein said logic unit receives said first and second digital signals, wherein said logic unit operates to calculate a phase-error signal that represents said phase difference between said transmitter oscillator and said receiver oscillator, and wherein said logic unit detects the difference between the magnitudes of said first and second digital signals.

* * * * *